United States Patent
Yamamoto (10) Patent No.: US 10,403,797 B2
(45) Date of Patent: Sep. 3, 2019

(54) LIGHT-EMITTING DEVICE AND ILLUMINATION APPARATUS

(71) Applicant: PANASONIC INTELLECTUAL PROPERTY MANAGEMENT CO., LTD., Osaka (JP)

(72) Inventor: Yuya Yamamoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 68 days.

(21) Appl. No.: 15/058,334

(22) Filed: Mar. 2, 2016

(65) Prior Publication Data

US 2016/0268480 A1 Sep. 15, 2016

(30) Foreign Application Priority Data

Mar. 9, 2015 (JP) .................................. 2015-046468

(51) Int. Cl.
*H01L 33/50* (2010.01)
*H01L 25/075* (2006.01)
*H01L 33/54* (2010.01)

(52) U.S. Cl.
CPC .......... *H01L 33/50* (2013.01); *H01L 25/0753* (2013.01); *H01L 33/54* (2013.01)

(58) Field of Classification Search
CPC .................... H01L 33/0004–648; H01L 27/15
See application file for complete search history.

(56) References Cited

U.S. PATENT DOCUMENTS

| 9,059,382 B2 | 6/2015 | Yamamoto et al. |
| 9,117,988 B2 | 8/2015 | Nagahama et al. |

(Continued)

FOREIGN PATENT DOCUMENTS

| JP | 4-80989 A | 3/1992 |
| JP | 9-6259 A | 1/1997 |

(Continued)

OTHER PUBLICATIONS

Oct. 2, 2018 Japanese Office Action in corresponding Japanese patent application No. 2015-046468, 2 pages.

(Continued)

*Primary Examiner* — Cuong B Nguyen
(74) *Attorney, Agent, or Firm* — Greenblum & Bernstein, P.L.C.

(57) ABSTRACT

A light-emitting device includes: a substrate having a principal surface which includes a resist film; a first light-emitting element line mounted above the principal surface; a second light-emitting element line mounted above the principal surface; a first sealing member which is provided on the resist film and seals the first light-emitting element line; and a second sealing member which is provided on the resist film and seals the second light-emitting element line. In the light-emitting device, a color of light which the first sealing member emits as a result of light emission of the first light-emitting element line is different from a color of light which the second sealing member emits as a result of light emission of the second light-emitting element line, and the principal surface includes a region between the first sealing member and the second sealing member in which the resist film is not formed.

16 Claims, 9 Drawing Sheets

(56) References Cited

U.S. PATENT DOCUMENTS

| | | | |
|---|---|---|---|
| 2010/0277919 A1* | 11/2010 | Okada | H01L 25/0753 362/249.02 |
| 2011/0050071 A1* | 3/2011 | Chung | F21K 9/00 313/46 |
| 2011/0199788 A1* | 8/2011 | Park | G02B 6/0023 362/612 |
| 2012/0139003 A1 | 6/2012 | Zitzlsperger et al. | |
| 2012/0299463 A1 | 11/2012 | Kume | |
| 2014/0104850 A1 | 4/2014 | Yamamoto et al. | |
| 2015/0003039 A1 | 1/2015 | Liu et al. | |
| 2015/0249194 A1 | 9/2015 | Yamamoto et al. | |
| 2016/0079486 A1* | 3/2016 | Sugimoto | H01L 25/0753 257/88 |
| 2016/0109102 A1* | 4/2016 | Kim | F21V 21/005 362/249.03 |
| 2016/0223159 A1* | 8/2016 | Katoh | F21V 7/0083 |
| 2016/0276549 A1* | 9/2016 | Yamashita | H05B 37/02 |

FOREIGN PATENT DOCUMENTS

| | | |
|---|---|---|
| JP | 2012-59736 A | 3/2012 |
| JP | 2012-146470 A | 8/2012 |
| JP | 2012-248553 | 12/2012 |
| JP | 2012-531761 A | 12/2012 |
| JP | 2013-004815 | 1/2013 |
| JP | 2013-153081 | 8/2013 |
| JP | 2014-110301 | 6/2014 |
| JP | 2014-150293 | 8/2014 |
| JP | 2015-12293 A | 1/2015 |

OTHER PUBLICATIONS

A Decision of Refusal dated Feb. 26, 2019 for the corresponding Japanese patent application No. 2015-046468.

* cited by examiner

LIGHT-EMITTING DEVICE AND ILLUMINATION APPARATUS

CROSS REFERENCE TO RELATED APPLICATION

This application claims the benefit of priority of Japanese Patent Application Number 2015-046468 filed on Mar. 9, 2015, the entire content of which is hereby incorporated by reference.

BACKGROUND

1. Technical Field

The present disclosure relates to a light-emitting device and the like in which a light-emitting element mounted above a substrate is sealed with light-transmissive resin.

2. Description of the Related Art

Semiconductor light-emitting elements such as LEDs (light emitting diodes) are widely used as efficient, space-saving light sources in various illumination apparatus for lighting purposes, display purposes, and so on.

A COB (chip-on-board) light-emitting module (a light-emitting device) in which an LED mounted above a substrate is sealed with light-transmissive resin (a sealing member) is known (for example, see Patent Literature 1: Japanese Unexamined Patent Application Publication No. 2012-248553).

SUMMARY

In a COB light-emitting device such as that cited above, it is undesirable that sealing members which are expected to be separate from each other be mixed together because this will cause a change in light distribution and color of emitted light.

In view of this; the present; disclosure provides a light-emitting device in which sealing members are not readily mixed together and an illumination apparatus including the light-emitting device.

A light-emitting device according to an aspect of the present disclosure includes: a substrate having a principal surface which includes a resist film; a first light-emitting element mounted above the principal surface; a second light-emitting element mounted above the principal surface; a first; sealing member which is provided on the resist film and seals the first light-emitting element; and a second sealing member which is provided on the resist film and seals the second light-emitting element, wherein a color of light which the first sealing member emits as a result of light emission of the first light-emitting element is different from a color of light which the second sealing member emits as a result of light emission of the second light-emitting element, and the principal surface includes a region between the first sealing member and the second sealing member in which the resist film is not formed.

An illumination apparatus according to an aspect of the present disclosure includes the above-described light emitting device.

According to the present disclosure, a light-emitting device in which sealing members are not readily mixed together and an illumination apparatus including the light-emitting device are provided.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Hereinafter, the light-emitting device and the like according to embodiments are described with reference to the Drawings. Note that each of the embodiments described below shows a specific example of the present disclosure. Therefore, the numerical values, shapes, materials, structural elements, and arrangement and connection of the structural elements etc., shown in the following embodiments are mere examples, and are not intended to limit the present disclosure. Consequently, among the structural elements in the following embodiments, structural elements not recited in any one of the independent claims which indicate the broadest concepts of the present disclosure are described as arbitrary structural elements.

Note that the respective figures are schematic diagrams and are not necessarily precise illustrations. Additionally, substantially the same structural elements in the figures share the same reference signs, and description that would overlap may be omitted or simplified.

Embodiment 1

Figure 1:
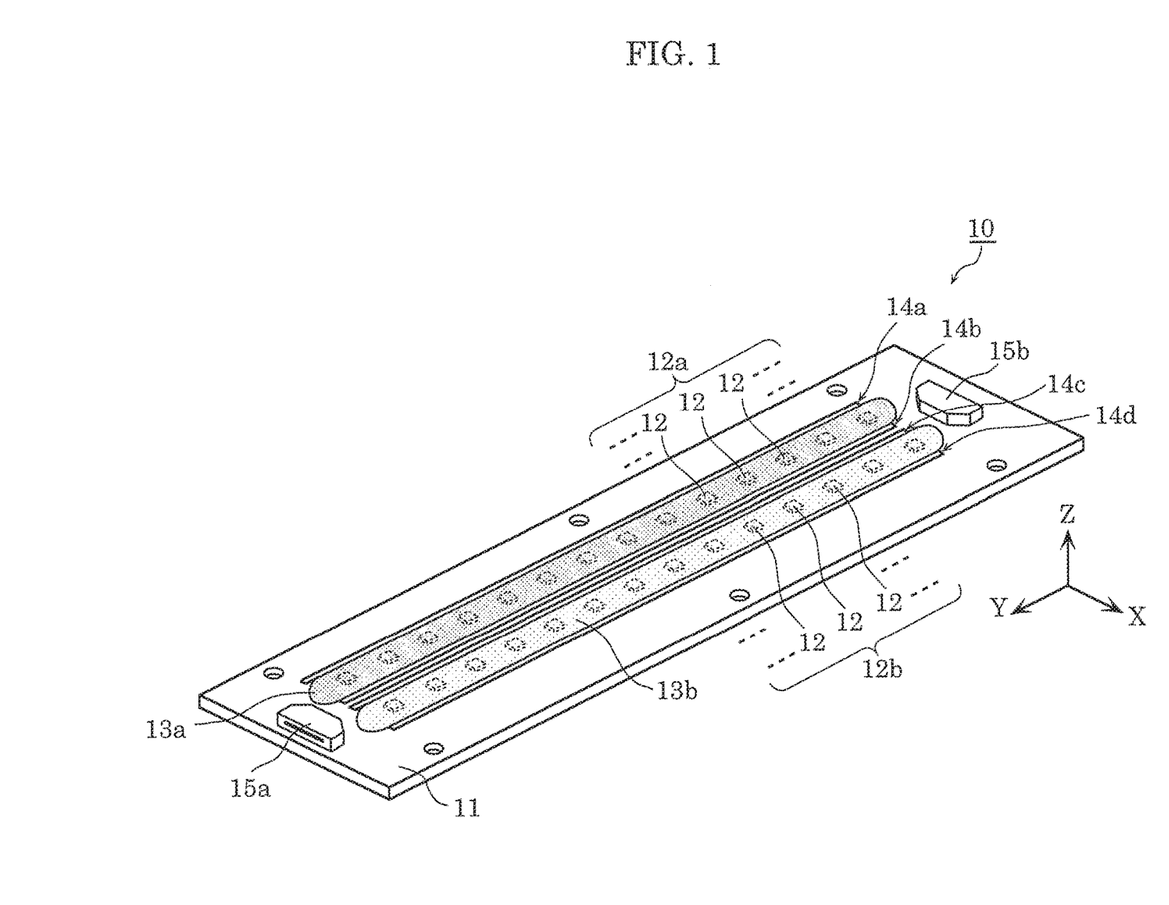
FIG. 1 is a perspective view (a schematic view) of an external appearance of a light-emitting device according to Embodiment 1.
Figure 2:
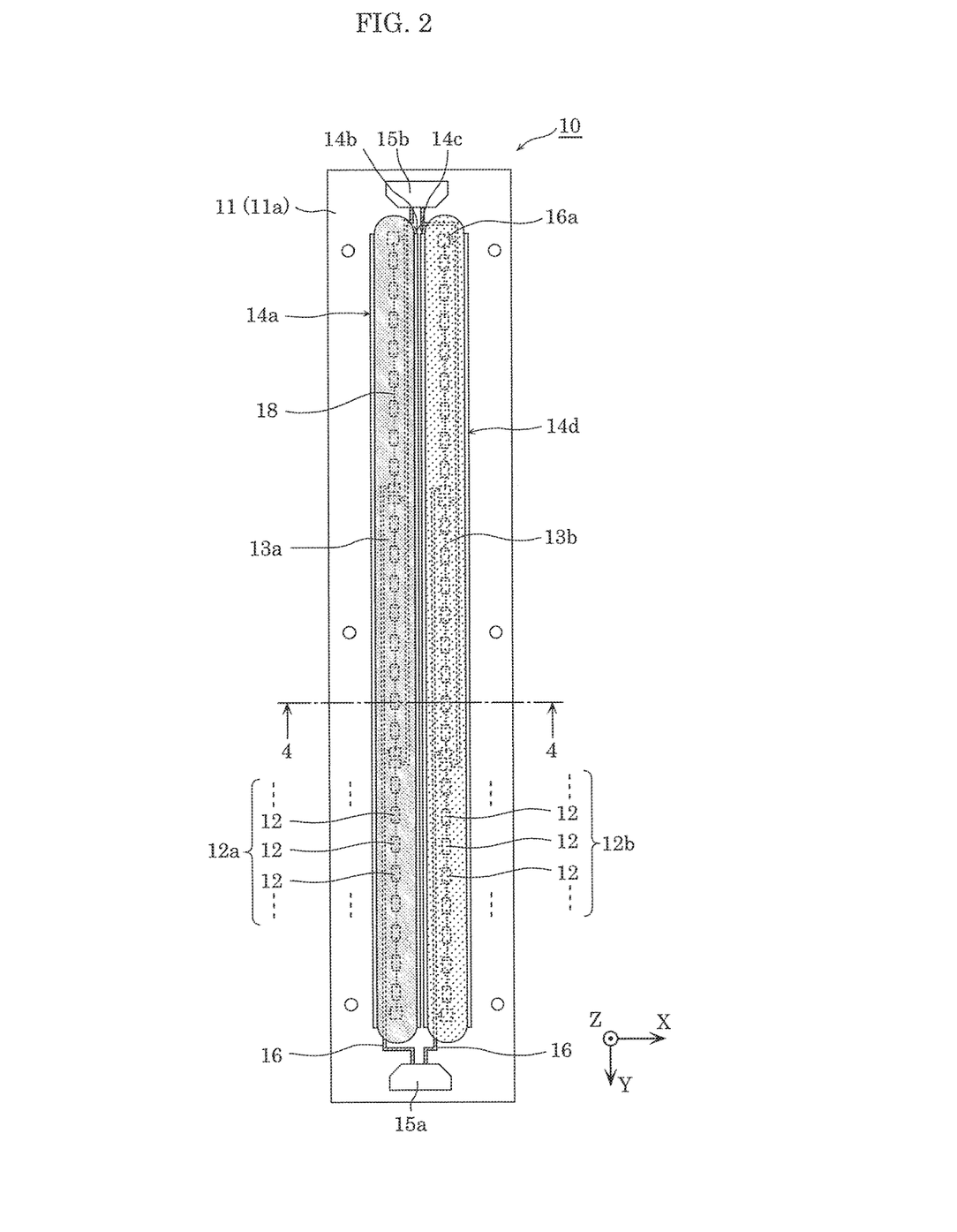
FIG. 2 is a top view of a light-emitting device according to Embodiment
Figure 3:
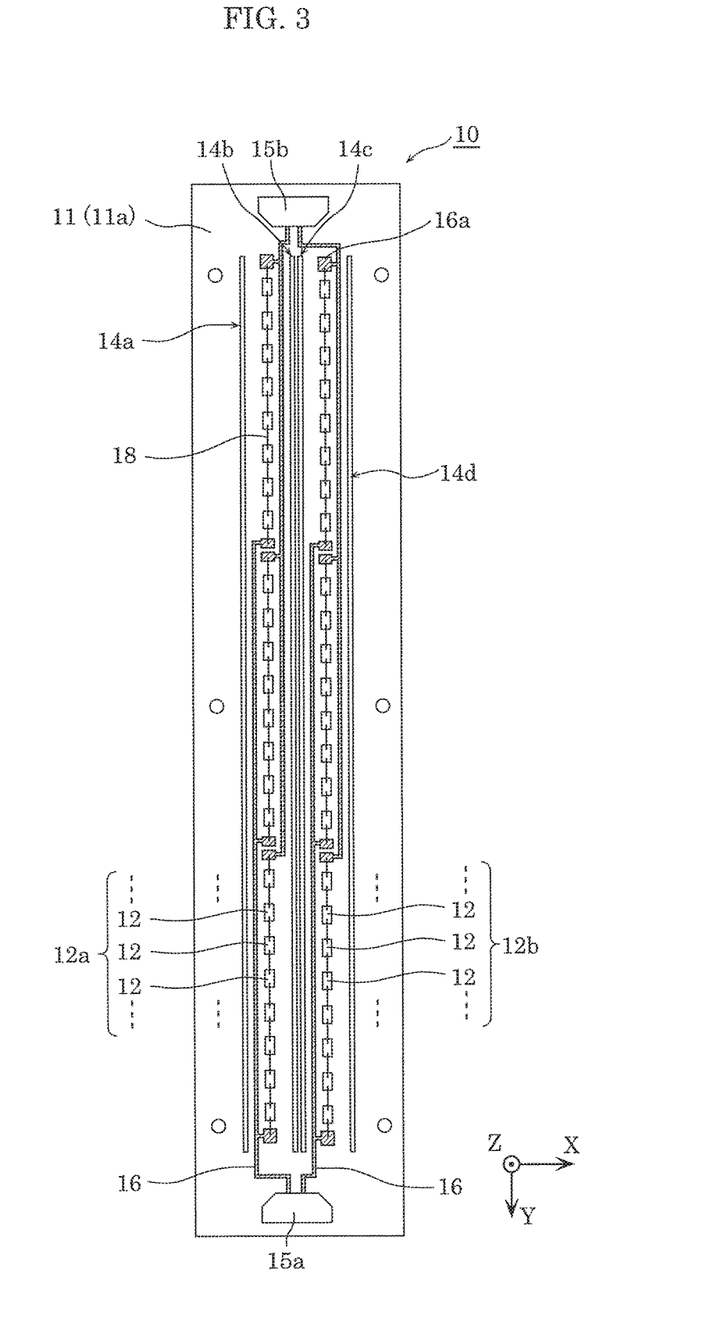
FIG. 3 is a top view representing positions of components on and above a substrate in a light-emitting device (which is almost identical to FIG. 2 except that the illustration of a sealing member therein is omitted)
Figure 4:
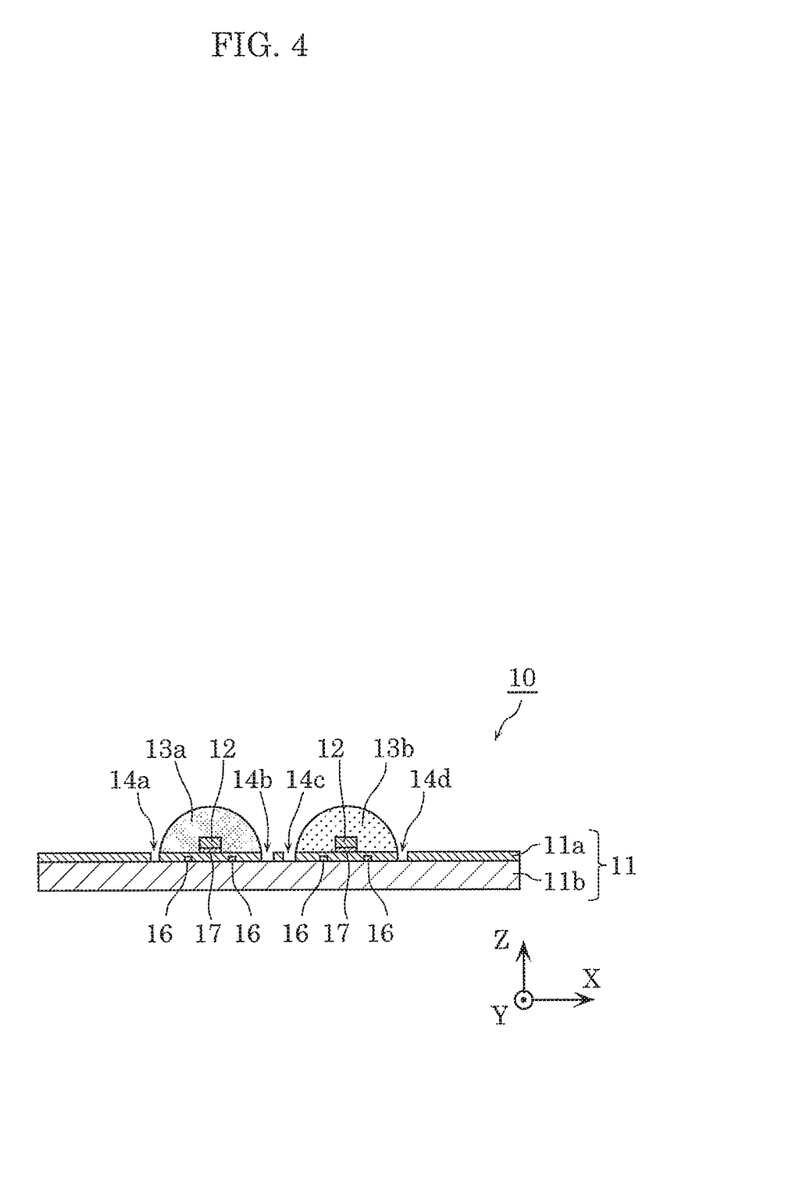
FIG. 4 is a cross-sectional view of a light-emitting device cut along line 4-4 of FIG. 2.

Hereinafter, a structure of a light-emitting device according to Embodiment 1 is described with reference to the Drawings. FIG. 1 is a perspective view (a schematic view) of an external appearance of a light-emitting device according to Embodiment 1. FIG. 2 is a top view of a light-emitting device according to Embodiment 1. FIG. 3 is a top view representing positions of components on and above a substrate in a light-emitting device (which is almost identical to FIG. 2 except that the illustration of a sealing member therein is omitted). FIG. 4 is a cross-sectional view of a light-emitting device cut along line 4-4 of FIG. 2. Note that FIG. 1 schematically illustrates an outline of the light-emitting device and may be different in detailed, structure from FIG. 2 to FIG. 4.

In FIG. 1 to FIG. 4, the Z-axis direction is a vertical direction, for example, and the Z-axis plus side and Z-axis minus side are expressed as top/up/above and bottom/down/below, respectively, in the Description. Furthermore, in FIG.

1 to FIG. 4, the X-axis direction and the Y-axis direction are directions orthogonal to each other on a plane vertical to the Z-axis (the horizontal plane).

As illustrated in FIG. 1 to FIG. 4, light-emitting device 10 includes: substrate 11; first light-emitting element line 12a and second light-emitting element line 12b mounted above a principal surface of substrate 11; first sealing member 13a sealing first light-emitting element line 12a; and second sealing member 13b sealing second light-emitting element line 12b. Furthermore, connectors 15a and 15b are also mounted on the principal surface of substrate 11.

Light-emitting device 10 is a COB LED module in which plural LEDs 12 are directly mounted above substrate 11. Each structural element of light-emitting device 10 is described below.

Substrate 11 is an elongated plate member which is long in the Y-axis direction and has a principal surface which includes resist film 11a (illustrated in FIG. 4). In other words, substrate 11 includes base substrate 11b and resist film 11a formed above a top surface of base substrate 11b.

Base substrate 11b (substrate 11) is a CEM-3 (composite epoxy material-3) substrate which uses resin as a base material Embodiment 1, but may be other resin substrate, a metal-based substrate, or a ceramic substrate. An example of the other resin substrate is a FR-4 (flame retardant-4) substrate. An example of the ceramic substrate is an alumina substrate made from aluminum oxide (alumina) or an aluminum nitride substrate made from aluminum nitride. An example of the metal-based substrate is an aluminum alloy substrate, an iron alloy substrate, or a copper alloy substrate. Note that base substrate 11b (substrate 11) is in the form of a rectangle in Embodiment 1, but may be in some other form such as a circle.

Resist film 11a is an insulating film formed in the principal surface of substrate 11 and coats wiring pattern 16 formed on the top surface of base substrate 11b. Resist film 11a is white and has a function of enhancing light reflecting properties of substrate 11. Such a function of enhancing light reflecting properties is useful especially in a substrate made from resin. Wiring pattern 16, which is represented by solid lines in FIG. 2 and FIG. 3, is coated with resist film 11a except electrode pattern 16a. Electrode pattern 16a is not coated with resist film 11a and is exposed to the outside, allowing bonding wire 18 to be bonded thereto.

First light-emitting element line 12a includes plural LEDs 12 mounted above the principal surface of substrate 11. Plural LEDs 12 which are included in first light-emitting element line 12a are linearly arranged side by side in the Y-axis direction. Note that LED 12 which is included in first light-emitting element line 12a is an example of the first light-emitting element.

More specifically, as illustrated in FIG. 3, first light-emitting element line 12a includes three light-emitting element groups connected in parallel by wiring pattern. 16. Each of the three light-emitting element groups includes plural LEDs 12 connected chip to chip in series by bonding wire 18. The three light-emitting element groups are arranged side by side in the Y-axis direction. Note that such an electrical connection between LEDs 12 is exemplary; plural LEDs 1.2 which are included in first light-emitting element line 12a may be electrically connected in any manner. A metal material of wiring pattern 16 and bonding wire 18 is, for example, gold (Au), silver (Ag), or copper (Cu).

Second light-emitting element line 12b includes plural LEDs 12 mounted above the principal surface of substrate 11 as does first light-emitting element line 12a. Plural LEDs 12 which are included in second light-emitting element line 12b are linearly arranged side by side in the Y-axis direction. Note that LED 12 which is included, in second light-emitting element line 12b is an example of the second light-emitting element. An electrical connection between plural LEDs 12 which are included in second light-emitting element line 12b is the same or similar to that in first light-emitting element line 12a.

Structurally, first light-emitting element line 12a and second light-emitting element line 12b are mounted. In parallel above the principal surface of substrate 11. The number of LEDs 12 which are included in first light-emitting element line 12a and the number of LEDs 12 which are included in second light-emitting element line 12b are the same. LEDs 12 of the light-emitting element lines are mounted so as to be aligned in the X-axis direction (the direction in which a shorter side of substrate 11 extends). This means that plural LEDs 12 are mounted in a matrix above the principal surface of substrate 11. Note that the number of LEDs 12 which are included in first light-emitting element line 12a and the number of LEDs 12 which are included in second light-emitting element line 12b may be different.

First light-emitting element line 12a and second light-emitting element line 12b emit light independently of each other under the control of a control circuit (not illustrated in the Drawings) electrically connected thereto via connectors 15a and 15b. As described later, a color temperature of white light which first sealing member 13a sealing first light-emitting element line 12a emits is different from a color temperature of white light which second sealing member 13b sealing second light-emitting element line 12b emits. Therefore, independent control on light emission of each of first light-emitting element line 12a and second light-emitting element line 12b makes it possible to control the color of light which light-emitting device 10 emits.

LED 12 is an example of the light-emitting element and is a bare chip that emits visible light of a single color. Specifically, LED 12 is a blue LED and is, for example, a gallium nitride semiconductive light-emitting element made from an InGaN material and having a center wavelength (a peak wavelength in the light spectrum) in the range from 430 nm to 500 nm. LED 12 is mounted above resist film 11a with die-bonding material 17 as illustrated in FIG. 4, but may be flip-chip mounted on wiring pattern 16; how to mount LED 12 is not particularly limited.

First sealing member 13a has an elongated shape on resist film 11a, and seals first light-emitting element line 12a. Specifically, first sealing member 13a is formed from a light-transmissive resin material containing phosphor. As the light-transmissive resin material, a silicone resin is used, for example. As the phosphor, a yttrium aluminum garnet (YAG) green phosphor (which may also be referred to as a yellow phosphor) is adopted, for example.

In Embodiment 1, first sealing member 13a contains a red phosphor in addition to the green phosphor. The red phosphor is specifically a sulfide phosphor, a silicate phosphor, or a nitride (oxynitride) phosphor.

Note that first sealing member 13a and second sealing member 13b do not always need to be formed from a resin material and may be formed from an organic material such as a fluororesin or an inorganic material such as low-melting-point glass or sol-gel glass. Furthermore, first sealing member 13a and second sealing member 13b may contain a light diffusing material, such as silica, in addition to the phosphors.

Part of blue light emitted by first light-emitting element line 12a excites the green phosphor and the red phosphor contained in first sealing member 13a, causing the green phosphor to emit green light and causing the red phosphor to emit red light. A center wavelength (a peak wavelength in the light spectrum) of the green light is, for example, in the range from 500 nm to 600 nm. A center wavelength of the red light is, for example, in the range from 600 nm and 660 nm.

The blue light emitted by LED 12 and the green light and the red light are mixed, resulting in white light. The color temperature of the white light emitted from first sealing member 13a is, for example, 2,200 K (warm white).

Second sealing member 13b has an elongated shape on resist film 11a, and seals second light-emitting element line 12b. Specifically, second sealing member 13b is formed from a light-transmissive resin material containing phosphor. As is first sealing member 13a, second sealing member 13b is formed from a silicone resin containing a green phosphor and a red phosphor.

A content percentage (a content) of the phosphor in first sealing member 13a is different from a content percentage (a content) of the phosphor in second sealing member 13b. Specifically, a content percentage of the red phosphor in first sealing member 13a is higher than that in second sealing g member 13b. Therefore, a color of light which first sealing member 13a emits as a result of light emission of first light-emitting element line 12a is different from a color of light which second sealing member 13b emits as a result of light emission of second light-emitting element line 12b. Specifically, the color temperature of the white light emitted from second sealing member 13b is, for example, 8,000 K (white).

Light-emitting device 10 is capable of adjusting the color temperature in the range from 2,200 K to 8,000 K (color adjustment) by adjusting current which flows through first light-emitting element line 12a and current which flows through second light-emitting element line 12b.

Connectors 15a and 15b are connecting units (connection interfaces) for supplying electric power to first light-emitting element line 12a and second light-emitting element; line 12b. Lead wires having connectors at ends, for example, are connected to connectors 15a and 15b. Each of connectors 15a and 15b is electrically connected to first light-emitting element line 12a and second light-emitting element line 12b by wiring pattern 16.

[Characteristic Structure]

Light-emitting device 10 is characterized in that resist film 11a has openings 14b and 14c between first sealing member 13a and second sealing member 13b. In other words, the principal surface of substrate 11 includes a region between first sealing member 13a and second sealing member 13b in which resist film 11a is not formed.

Specifically, two openings 14a and 14b are provided in resist film 11a so as to sandwich first sealing member 13a in the direction of the width of substrate 11 (the X-axis direction). Likewise, two openings 14c and 14d are provided in resist film 11a so as to sandwich second sealing member 13b in the direction of the width of substrate 11.

Openings 14a and 14b are provided, along first sealing member 13a (first light-emitting element line 12a), and openings 14c and 14d are provided along second sealing member 13b (second light-emitting element line 12b). Each of openings 14a to 14d has an elongated shape (the shape of a slit) that is long in the Y-axis direction. The Y-axis length of openings 14a to 14d (which is a length in the direction in which a longer side of the shape extends) os greater than the Y-axis length of first light-emitting element line 12a and second light-emitting element line 12b and is smaller than the Yaxis length of first sealing member 13a and second sealing member 13b. In openings 14a to 14d, base substrate 11b is exposed to the outside. As a result of openings 14a to 14d being provided in resist film 11a as described above, the principal surface of substrate 11 is depressed down at positions corresponding to openings 14a to 41d.

In a conventional light-emitting device, so as to prevent a sealing member from flowing and spreading, time management after application of the sealing member is needed so that the sealing member is cured. In contrast, in light-emitting device 10, even if first sealing member 13a applied to seal first light-emitting element line 12a flows and spreads, such first sealing member 13a stops flowing by the surface tension thereof at step portions formed by openings 14a and 14b. Likewise, even if second sealing member 13b applied to seal second light-emitting element line 12b flows and spreads, such second sealing member 13b stops flowing by the surface tension thereof at step portions formed by openings 14c and 14d.

This means that light-emitting device 10 is capable of easily reducing the occurrence of the sealing member flowing and spreading without the need for time management after the application. In particular, there may be considerable individual variation in color of light emitted by light-emitting devices in each of which two types of sealing members (first sealing member 13a and second sealing member 13b) are used, just like light-emitting device 10, if first sealing member 13a and second sealing member 13b are mixed together. In this regard, with resist film 11a having openings 14b and 14c between first light-emitting element line 12a and second light-emitting element line 12b, the occurrence of first sealing member 13a and second sealing member 13b being mixed together can be easily reduced, so that the individual variation of color of light emitted, by light-emitting devices 10 can be reduced.

As described above, light-emitting device 10 includes: substrate 11 having a principal surface which includes resist film 11a; and first light-emitting element line 12a (a first light-emitting element) and second light-emitting element line 12b (a second light-emitting element) mounted above the principal surface. Furthermore, light-emitting device 10 includes: first sealing member 13a which is provided on resist film 11a and seals first light-emitting element line 12a; and second sealing member 13b which is provided on resist film 11a and seals second light-emitting element line 12b.

A color of light which first sealing member 13a emits as a result of light emission of first light-emitting element line 12a is different from a color of light which second sealing member 13b emits as a result of light emission of second light-emitting element line 12b. The principal surface of substrate 11 includes a region between first sealing member 13a and second sealing member 13b in which resist film 11a is not formed with opening 14b and opening 14c.

With this, the occurrence of first sealing member 13a and second sealing member 13b being mixed together can be easily reduced. Note that with at least one of openings 14b and 14c between first sealing member 13a and second sealing member 13b, an effect of easily reducing the occurrence of first sealing member 13a and second sealing member 13b being mixed together can be obtained.

[Variation]

Figure 5:
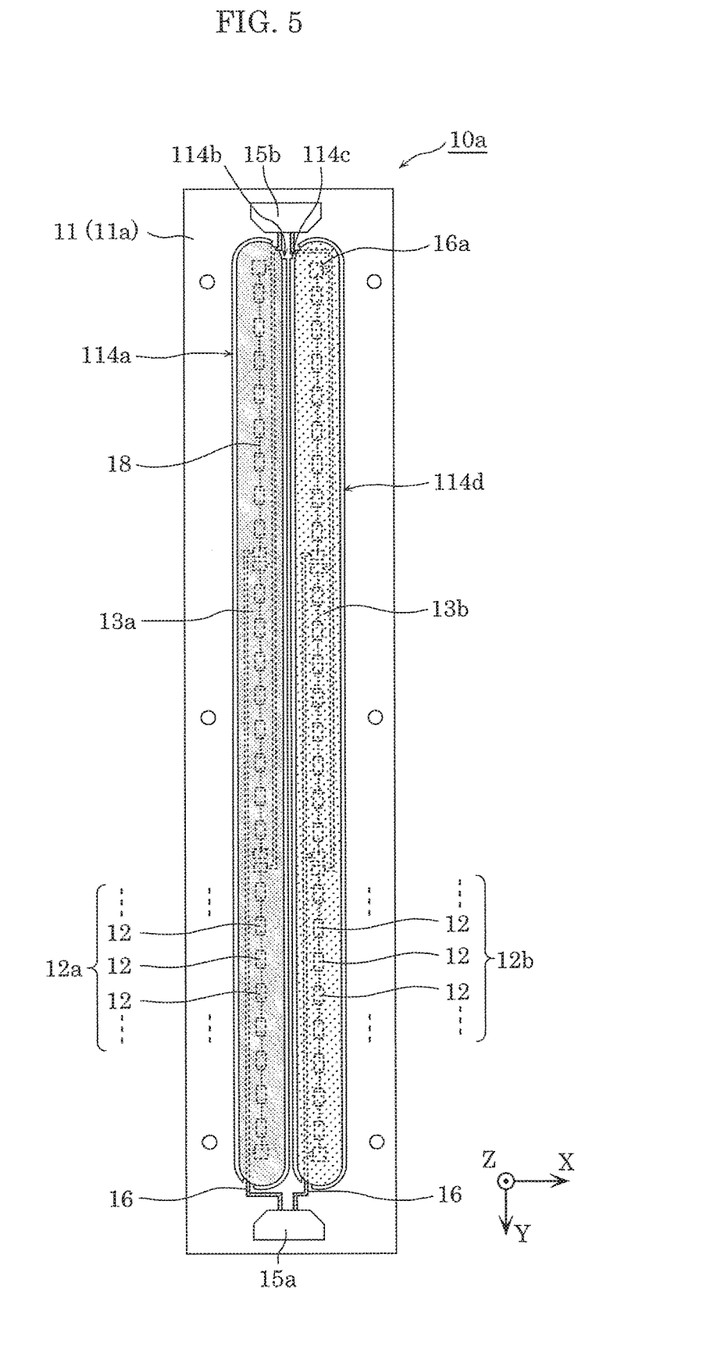
FIG. 5 is a top view of a light-emitting device according to a variation.

The region in which resist film 11a is not formed may be provided so as to surround at least one of first sealing member 13a and second sealing member 13b. FIG. 5 is a top view of a light-emitting device according to such a variation.

Resist film 11a of light-emitting device 10a illustrated in FIG. 5 has openings 114a and 114b which extend along the outline of first sealing member 13a (the outline in a top view) so as to surround first sealing member 13a. In other words, the region in which resist film 11a is not formed (openings 114a and 114b) substantially surrounds first sealing member 13a.

Likewise, resist film 11a of light-emitting device 10a has openings 114c and 114d which extend along the outline of second sealing member 13b so as to surround second sealing member 13b. In other words, the region in which resist film 11a is not formed (openings 114c and 114d) substantially surrounds second sealing ember 13b. Note that resist film 11a still coats wiring pattern 16.

With this configuration, an effect of further stabilizing (reducing variation in) the shape of first sealing member 13a and second sealing member 13b can be obtained.

[Method for Manufacturing Light-Emitting Device]

Figure 6:
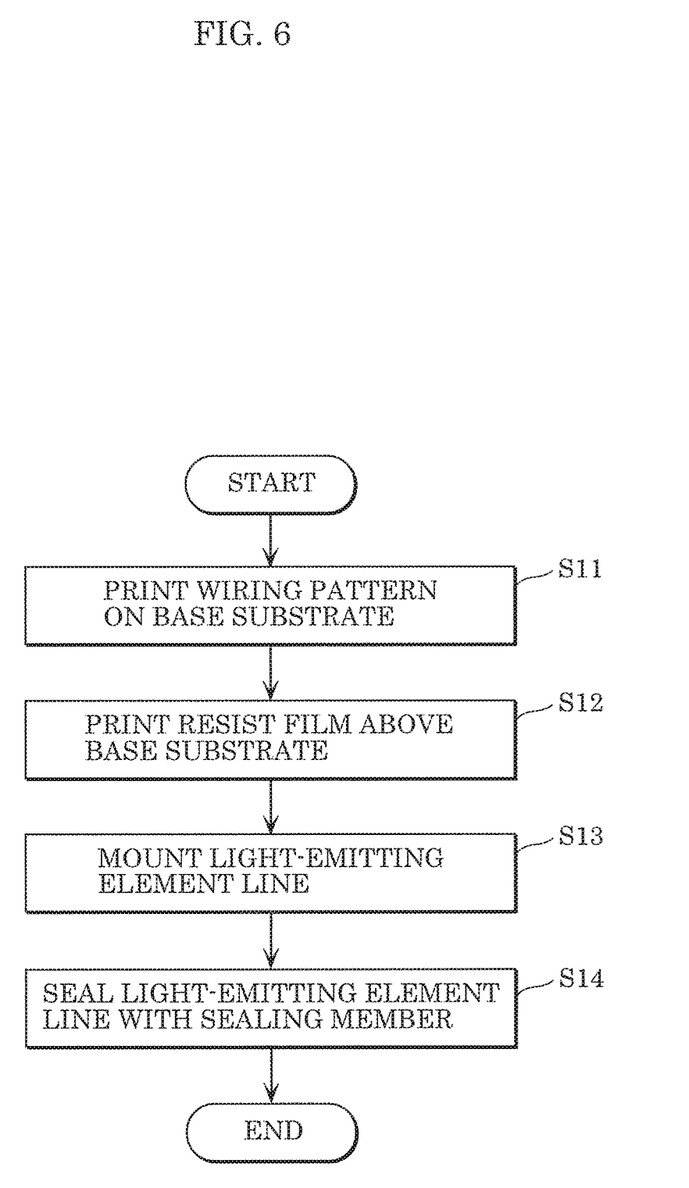
FIG. 6 is a flow chart of a method for manufacturing a light-emitting device according to Embodiment 1.

The following shall supplement the descriptions about a method for manufacturing light-emitting device 10. FIG. 6 is a flow chart of a method for manufacturing light-emitting device 10. Note that the flow chart illustrated in FIG. 6 is an example.

In the manufacture of light-emitting device 10, first, wiring pattern 16 is printed on base substrate 11b (S11). Next, resist film 11a is printed above base substrate 11b so as to coat wiring pattern 16 (S12). This results in substrate 11 having a principal surface which includes resist film 11a. At this time, resist film 11a is not printed, but openings 14b and 14c are provided, between a region to which first sealing member 13a is to be applied and a region to which second sealing member 13b is to be applied. Openings 14a and 14d are provided likewise.

Wiring pattern 16 and resist film 11a may be formed in other manner than printing. Openings 14a to 14d may be formed in other manner such as etching which removes part of resist film 11a.

Next, the light-emitting element line is mounted above substrate 11 (S13). Specifically, first light-emitting element line 12a and second light-emitting element line 12b are mounted. As described above, LEDs 12 which are included in first light-emitting element line 12a and second light-emitting element line 12b are mounted above resist film 11a with die-bonding material 17, which is followed by wire bonding.

Next, each of the light-emitting element lines is sealed with a sealing member (S14). Specifically, first light-emitting element line 12a is sealed overall with first sealing member 13a with an elongated shape, and second light-emitting element line 12b is sealed overall with second sealing member 13b with an elongated shape. At this time, since the principal surface of substrate 11 has steps formed by openings 14b and 14c, applied first sealing member 13a and second sealing member 13b stop flowing at the steps. Therefore, the occurrence of first sealing member 13a and second sealing member 13b being mixed together is reduced.

Embodiment 2

Figure 7:
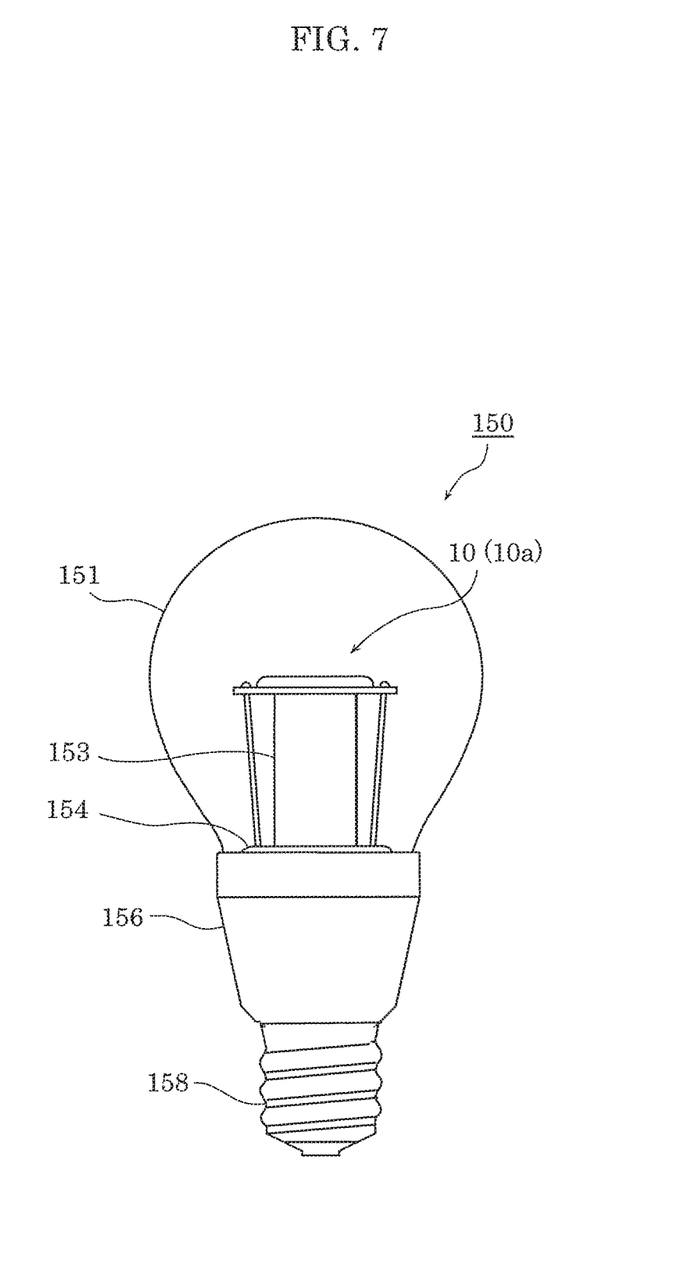
FIG. 7 illustrates a structural outline of a bulb lamp according to Embodiment 2.

Next, a structure of bulb lamp 150 according to Embodiment 2 is described with reference to FIG. 7. Note that in Embodiment 2 below, a light-emitting device different from light-emitting device 10 only in shape, size, or the like which is not an essence of the present disclosure is also referred to as light-emitting device 10. FIG. 7 illustrates a structural outline of bulb lamp 150 according to Embodiment 2.

Bulb lamp 150 illustrated in FIG. 7 is an example of the illumination apparatus (more specifically, a light source for illumination), and includes light-emitting device 10 according to Embodiment 1 described above.

Bulb lamp 150 includes light-transmissive globe 151, light-emitting device 10 which is a light source, case 156 in which a drive circuit for supplying electric power to light-emitting device 10 is housed, and base 158 which receives external power.

Alternating-current (AC) power received by base 158 is converted into direct-current (DC) power by the drive circuit and then supplied to light-emitting device 10. Note that the drive circuit is not required to have the function of converting DC power into AC power when DC power is supplied to base 158.

In Embodiment 2, light-emitting device 10 is supported by column 153 and positioned in a central area of globe 151. Column 153 is a metallic stick provided so to extend towards the inside of globe 151 from near an opening of globe 151.

Specifically, column 153 is connected to support plate 154 disposed near the opening of globe 151.

Note that light-emitting device 10 may be directly supported by support plate 154 instead of by column 153. Specifically, light-emitting device 10 may be attached to a surface of support plate 154 that faces globe 151.

Globe 151 is a light-transmissive cover that transmits light from light-emitting device 10 outward. In Embodiment 2, globe 151 is made from a material transparent for the light from light-emitting device 10. An example of such globe 151 is a glass bulb (a clear bulb) made from silica glass transparent for visible light.

In this case, light-emitting device 10 housed in globe 151 is visible from outside globe 151.

Note that globe 151 is not necessarily required to be transparent for visible light; globe 151 may have a light diffusing function. For example, it may be possible to form a creamy white light-diffusing film by applying, to the entire inner or outer surface of globe 151, a resin, white pigment, or the like, which contains a light-diffusing material such as silica or calcium carbonate. The material of globe 151 is not limited to a glass material and may be a resin material including a synthetic resin such as acrylic (poly(methyl methacrylate) (PMMA)) or polycarbonate (PC).

The shape of globe 151 is not particularly limited. For example, semispherical globe 151 may be adopted when light-emitting device 10 is directly supported by support plate 154 (when column 153 is not provided).

As described above, the present disclosure can be implemented as bulb lamp 150 including light-emitting device 10. Note that bulb lamp 150 may include, instead of light-emitting device 10, light-emitting device 10a described in Embodiment 1.

Furthermore, the present disclosure may be implemented as a light source for illumination (an illumination apparatus) other than bulb lamp 150. For example, the present disclosure may be implemented as a straight tube lamp.

Embodiment 3

Next, illumination apparatus 200 according to Embodiment 3 is described with reference to FIG. 8 and FIG. 9. Note that in Embodiment 3 below, a light-emitting device different from light-emitting device 10 only in shape, size, or the like which is not an essence of the invention is also referred to as light-emitting device 10.

Figure 8:
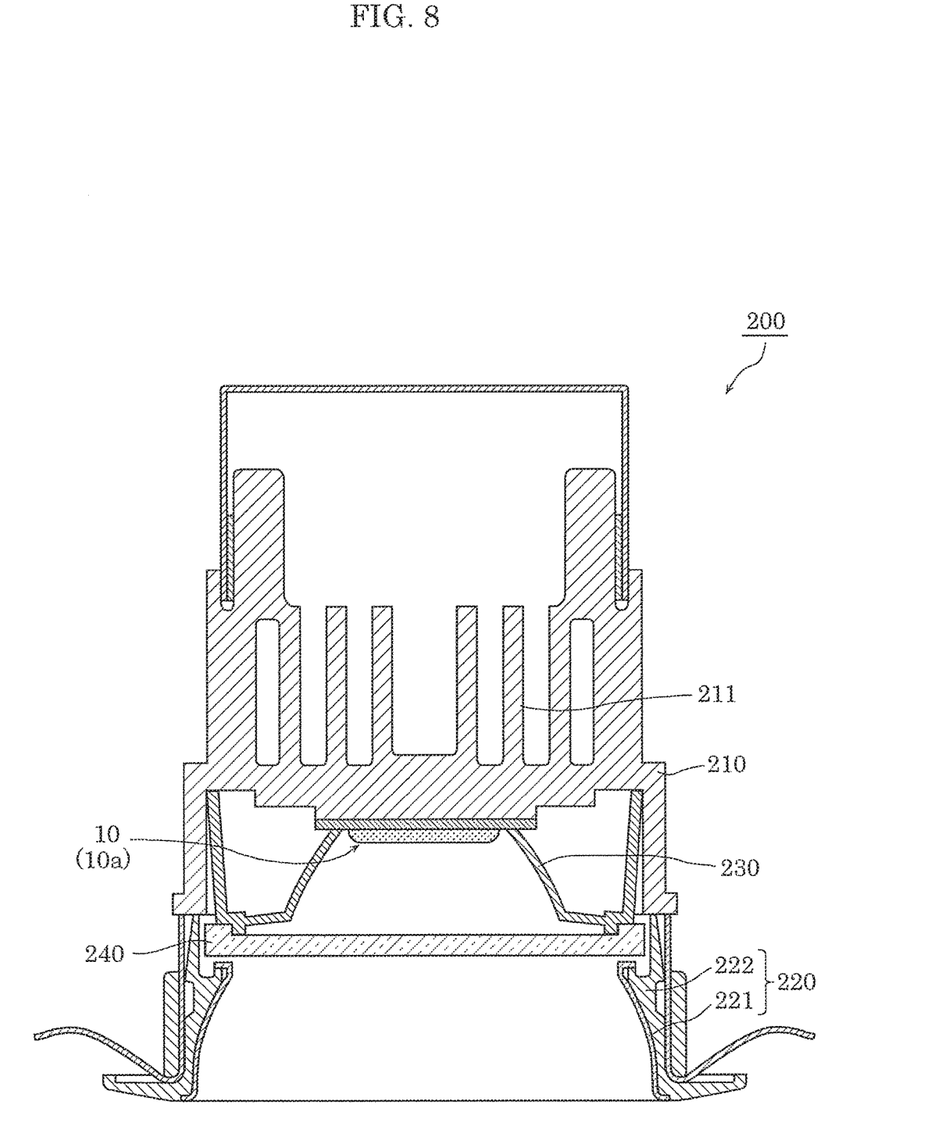
FIG. 8 is a cross-sectional view of an illumination apparatus according to Embodiment 3.

FIG. 8 is a cross-sectional view of illumination apparatus 200 according to Embodiment 3. FIG. 9 is a perspective view of external appearances of illumination apparatus 200 and peripheral members thereof according to Embodiment 3.

Figure 9:
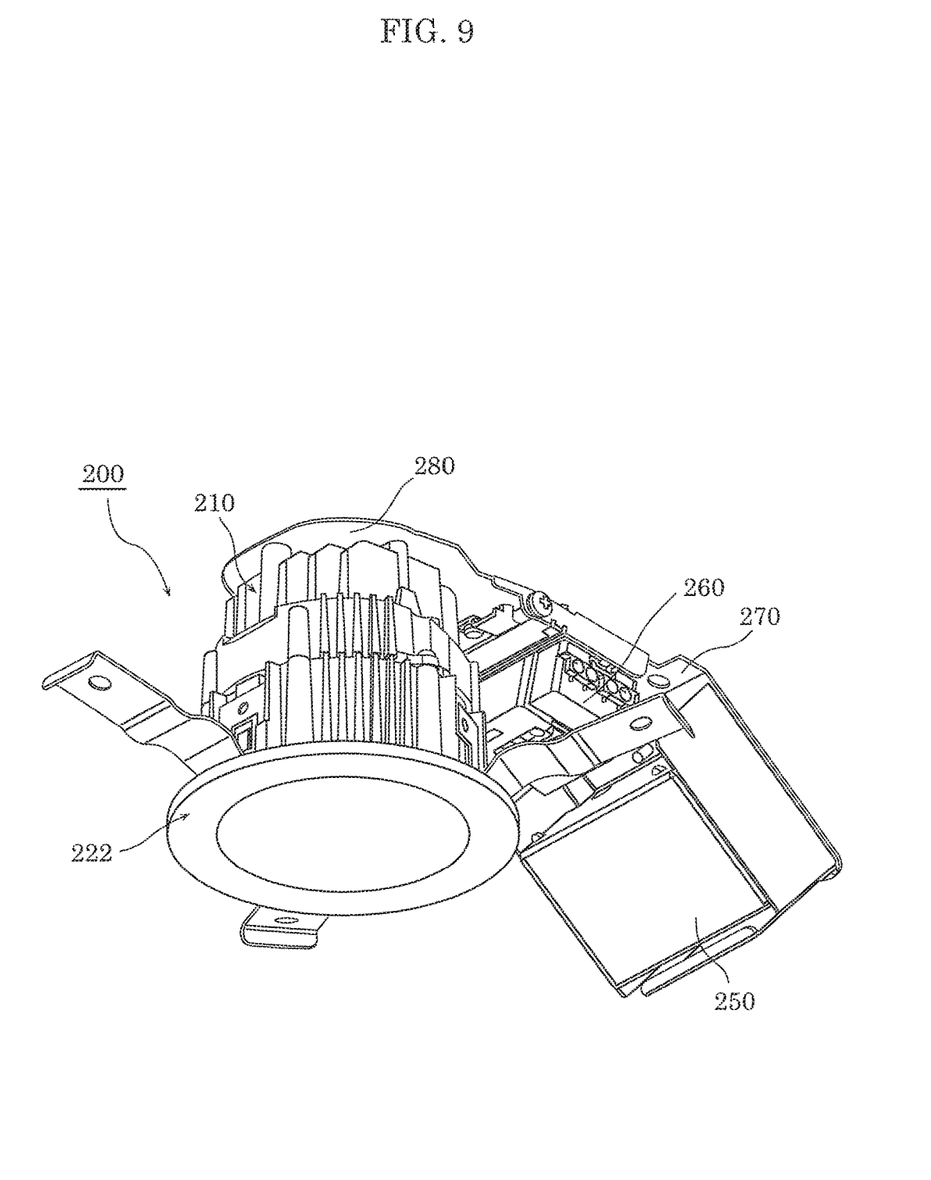
FIG. 9 is a perspective view of external appearances of an illumination apparatus and peripheral members thereof according to Embodiment 3.

As illustrated in FIG. 8 and FIG. 9, illumination apparatus 200) according to Embodiment 3 is a sunken illumination apparatus, such as a recessed light, that emits light downward (toward the floor or a wall, for example) by being installed, for example, in the ceiling of a house.

Illumination apparatus 200 includes light-emitting device 10 according to Embodiment 1 described, above. Illumination apparatus 200 further includes: an apparatus body formed by joining pedestal 210 and frame 220 together and having a substantially closed-bottom tubular shape; and reflection plate 230 and light-transmissive panel 240 disposed in the apparatus body.

Pedestal 210 is an attachment base to which light-emitting device 10 is attached, and also serves as a heat sink for dissipating heat generated by light-emitting device 10. Pedestal 210 is formed into a substantially columnar shape using a metal material aid is, in Embodiment 3, made from die-cast aluminum.

Plural heat-dissipating fins 211 are provided at predetermined intervals along one direction on the top portion (ceiling-side portion) of pedestal 210 so as to protrude upward. With this, heat generated by light-emitting device 10 can be efficiently dissipated.

Frame 220 includes: cone portion 221 including a reflective surface on an inner surface and having a substantially circular tube shape; and frame body 222 to which cone portion 221 is attached. Cone portion 221, is formed using a metal material and can, for example, be formed from an aluminum alloy or the like by metal spinning or pressing. Frame body 222 is formed from a hard resin material or a metal material. Frame 220 is fixed by frame body 222 being attached to pedestal 210.

Reflection plate 230 is an annular-frame-shaped (funnel-shaped) reflection member having an inner surface reflection function. For example, reflection plate 230 can be formed using a metal material such as aluminum. Note that reflection plate 230 may be formed using a hard white resin material instead of a metal material.

Light-transmissive panel 240 is a light-transmissive member having light-diffusing; properties and light-transmitting properties. Light-transmissive panel 240 is a flat plate disposed between reflection plate 230 and frame 220, and is attached to reflection plate 230. For example, light-transmissive panel 240 can be formed into a disc shape using a transparent resin material such as acrylic or polycarbonate.

Note that illumination apparatus 200 is not required to include light-transmissive panel 240. Eliminating light-transmissive panel 240 leads to improvement of a luminous flux of light output from illumination apparatus 200.

Furthermore, as illustrated in FIG. 9, lighting device 250 which supplies lighting power to light-emitting device 10 and terminal base 260 which relays AC power from a commercial power supply to lighting device 250 are connected to illumination apparatus 200.

Lighting device 250 and terminal base 260 are fixed to attachment plate 270 provided separately from the apparatus body. Attachment plate 270 is formed by folding a rectangular plate member made of a metal material, and has one longitudinal end the bottom surface of which lighting device 250 is fixed to and the other longitudinal end the bottom surface of which terminal base 260 is fixed to. Attachment plate 270 is connected together with top plate 280 which is fixed to a top portion of pedestal 210 of the apparatus body.

As described above, the present disclosure can also be implemented as illumination apparatus 200 including light-emitting device 10. Note that illumination apparatus 200 may include, instead of light-emitting device 10, light-emitting device 10a described in Embodiment 1.

Furthermore, the present disclosure may be implemented as an illumination apparatus other than a recessed light. For example, the present disclosure may be implemented as an illumination apparatus such as a spotlight or a ceiling light.

Other Embodiments

Although the light-emitting device and the illumination apparatus according to the embodiments have been described above, the present disclosure is not limited to the above-described embodiments For example, light-emitting device 10 (light-emitting device 10a) according to the above-described embodiments is designed to emit white light by using a combination of phosphor (a green phosphor and a red phosphor) and LED 12 which emits blue light, but a configuration for emitting white light is not limited to those in the above-described embodiments.

For example, the first sealing member and the second sealing member are not required to contain a red phosphor. Even when no red phosphor is contained, it is possible to emit white light by using a combination of a green phosphor and LED 12 which emits blue light.

Furthermore, for example, an ultraviolet LED which emits ultraviolet light having a shorter wavelength than blue light may be used in combination with blue phosphor particles, green phosphor particles, and red phosphor particles which emit blue light, red light, and green light, respectively, mainly when excited by ultraviolet light.

Furthermore, in the light-emitting device, it is sufficient that the color of light which the first sealing member emits as a result of light emission of the first light-emitting element line is different from the color of light which the second sealing member emits as a result of light emission of the second light-emitting element line. Therefore, the light-emitting device (the first sealing member and the second sealing member) is not necessarily required to emit white light. For example, the first sealing member and the second sealing member are not required to contain phosphor. It is expected that a sealing member containing no phosphor will be applied for the purpose of protecting LEDs.

Furthermore, although plural LEDs are linearly arranged to form a light-emitting element line in the above-described embodiments, such a structul is not the only example. For example, plural LEDs may be arranged in an arc to form a light-emitting element line.

Furthermore, the number of light-emitting element lines and the number of LEDs included in a light-emitting element line are not particularly limited. Moreover, one light-emitting element line may include more than one type of LED. For example, one light-emitting element line may include an LED which emits red light and an LED which emits blue light. Alternatively, each light-emitting element line may have a different type of LED (for example, an LED which emits light of a different color).

Furthermore, the LED is cited as an example of the light-emitting element used in the light-emitting device in the above-described embodiments. However, as the light-emitting element included in the light-emitting device, other types of solid-state light-emitting elements are also applicable such as a semiconductor light-emitting element represented by a semiconductor laser, or an EL (electroluminescence) element represented by an organic EL element or an inorganic EL element.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein it is intended by the following claims to claim any and all modifications and variations that fall within the true scope of the present teachings.

For example, the present disclosure may be implemented as a method for manufacturing a light-emitting device.

What is claimed is:

1. A light-emitting device comprising:
a substrate having a principal surface which includes a resist film;
a first light-emitting element above the principal surface;
a second light-emitting element above the principal surface;
a first sealing member on the resist film and seals the first light-emitting element; and
a second sealing member on the resist film and seals the second light-emitting element, wherein
the first light-emitting element and the first sealing member are denoted as a first combination element and the second light-emitting element and the second sealing member are denoted as a second combination element,
the principal surface includes two regions between the first and the second combination elements in which the resist film is not provided; and
only a portion of the resist film is provided in a region between the two regions so that on the principal surface, only the portion of resist film is provided between the first and second combination elements, and the first and second combination elements are adjacent each other without any other light emitting elements and without any other sealing member directly above the portion of the resist film therebetween.

2. The light-emitting device according to claim 1,
wherein a first light-emitting element line including the first light-emitting element and a second light-emitting element line including the second light-emitting element are in parallel above the principal surface,
the first sealing member which seals the first light-emitting element line has an elongated shape,
the second sealing member which seals the second light-emitting element line has an elongated shape, and
the two regions of the principal surface, between the first sealing member and the second sealing member in which the resist film is not provided, have elongated shapes along the first sealing member and the second sealing member.

3. The light-emitting device according to claim 1,
wherein at least one of the regions in which the resist film is not provided substantially surrounds at least one of the first sealing member and the second sealing member.

4. The light-emitting device according to claim 1,
wherein each of the first sealing member and the second sealing member contains phosphor.

5. The light-emitting device according to claim 4,
wherein each of the first sealing member and the second sealing member contains a green phosphor.

6. The light-emitting device according to claim 4,
wherein each of the first sealing member and the second sealing member contains a green phosphor and a red phosphor.

7. The light-emitting device according to claim 4,
wherein a percentage of the phosphor contained in the first sealing member is different from a percentage of the phosphor contained in the second sealing member.

8. The light-emitting device according to claim 1,
wherein the substrate comprises a resin.

9. The light-emitting device according to claim 1,
wherein the resist film is white.

10. An illumination apparatus comprising
the light-emitting device according to claim 1.

11. The light-emitting device according to claim 1,
wherein a first light-emitting element line including the first light-emitting element and a second light-emitting element line including the second light-emitting element are in parallel above the principal surface,
the first sealing member which seals the first light-emitting element line has a line shape,
the second sealing member which seals the second light-emitting element line has a line shape, and
the two regions of the principal surface between the first sealing member and the second sealing member, in which the resist film is not provided, have line shapes along the first sealing member and the second sealing member.

12. The light emitting device according to claim 1,
wherein a space is provided between the first sealing member and the second sealing member, above the two regions in which the resist film is not provided.

13. The light-emitting device according to claim 12,
wherein the space is an open space.

14. A light emitting device comprising:
a substrate having a principal surface which includes a resist film;
a first light emitting element above the principal surface;
a second light emitting element above the principal surface;
a first sealing member on the resist film and which seals the first light emitting element; and
a second sealing member on the resist film and which seals the second light emitting element, wherein
the first light emitting element and the first sealing member are denoted as a first combination element and the second light emitting element and the second sealing member are denoted as a second combination element,
the principal surface includes
two first regions between the first and second combination elements in which the resist film is not provided,
a second region in which the resist film is not provided, the first combination element being positioned between the two first regions and the second region,
a third region in which the resist film is not provided, the second combination element being positioned between the two first regions and the third region, and
a fourth region positioned between the two first regions,
and
only a portion of the resist film is provided in the fourth region so that on the principal surface, only the portion of resist film is provided between the first and second combination elements, and the first and second combination elements are adjacent each other without any other light emitting elements and without any other sealing member directly above the portion of the resist film therebetween.

15. The light-emitting device according to claim 1,
wherein a color of light which the first sealing member emits as a result of light emission of the first light-emitting element is different from a color of light which the second sealing member emits as a result of light emission of the second light-emitting element.

16. The light-emitting device according to claim 14, wherein a color of light which the first sealing member emits as a result of light emission of the first light-emitting element is different from a color of light which the second sealing member emits as a result of light emission of the second light-emitting element.

\* \* \* \* \*